(12) United States Patent
Tsai et al.

(10) Patent No.: US 9,576,656 B2
(45) Date of Patent: Feb. 21, 2017

(54) DEVICE AND METHOD FOR SETTING RESISTIVE RANDOM ACCESS MEMORY CELL

(71) Applicant: Taiwan Semiconductor Manufacturing Company Limited, Hsinchu (TW)

(72) Inventors: Chun-Yang Tsai, New Taipei (TW); Yu-Wei Ting, Taipei (TW); Kuo-Ching Huang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 143 days.

(21) Appl. No.: 14/061,092

(22) Filed: Oct. 23, 2013

(65) Prior Publication Data

US 2015/0109849 A1    Apr. 23, 2015

(51) Int. Cl.
*G11C 13/00* (2006.01)

(52) U.S. Cl.
CPC ....... *G11C 13/0069* (2013.01); *G11C 13/0004* (2013.01); *G11C 13/0007* (2013.01); *G11C 2013/0078* (2013.01); *G11C 2213/72* (2013.01); *G11C 2213/79* (2013.01)

(58) Field of Classification Search
CPC ............ G11C 13/0069; G11C 13/0004; G11C 13/0007
USPC ...... 365/148, 171, 230.06, 189.011
See application file for complete search history.

(56) References Cited

U.S. PATENT DOCUMENTS

| | | | | |
|---|---|---|---|---|
| 2010/0110763 A1* | 5/2010 | Li | ............ | G11C 11/16 365/148 |
| 2013/0039118 A1* | 2/2013 | Tsukada | ............ | G11C 5/14 365/148 |
| 2013/0329484 A1* | 12/2013 | Tamai | ............ | G11C 13/0069 365/148 |

\* cited by examiner

*Primary Examiner* — Jason Lappas
(74) *Attorney, Agent, or Firm* — Jones Day

(57) ABSTRACT

A device and method for setting a resistive random access memory cell are provided. An exemplary method includes: providing a set current to a bit line of the RRAM cell by a current source. An exemplary device includes: a first RRAM cell and a current source. The first RRAM cell is connected to a first word line. The current source selectively connected to the first bit line. The current source selectively provides a current to the first bit line of the first RRAM cell to set the first RRAM cell.

14 Claims, 11 Drawing Sheets

| Process | | Set | Reset | Read |
|---|---|---|---|---|
| Word Line | Selected | 1.2~1.6V | 2.0~2.4V | 1.1V |
| | Unselected | 0 | 0 | 0 |
| Bit Line | Selected | 1uA~500uA | 0 | 0.3V |
| | Unselected | 0 | 0 | 0 |
| Source Line | Selected | 0 | 1.7~2.0V | 0 |
| | Unselected | 0 | 0 | 0 |

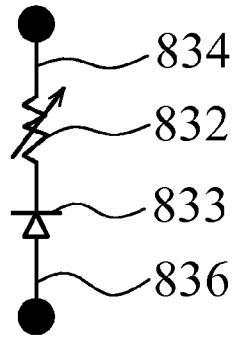
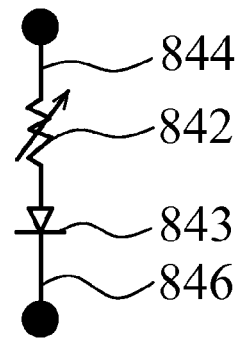
830  840
Fig.8c    Fig.8d
| Process | | Set | Reset | Read |
|---|---|---|---|---|
| Word Line | Selected | 0 | 1.7~2.0V | 0 |
| | Unselected | Floating or 0.3V | 0 | 0 |
| Bit Line | Selected | 1uA~500uA | 0 | 0.3V |
| | Unselected | Floating or 0.3V | 0 | 0 |
Fig.9

Set

Reset

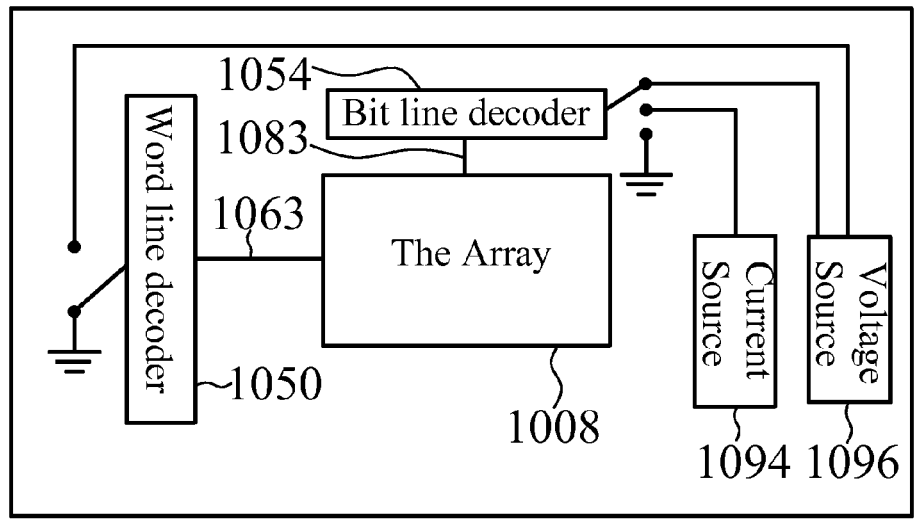
Fig. 12
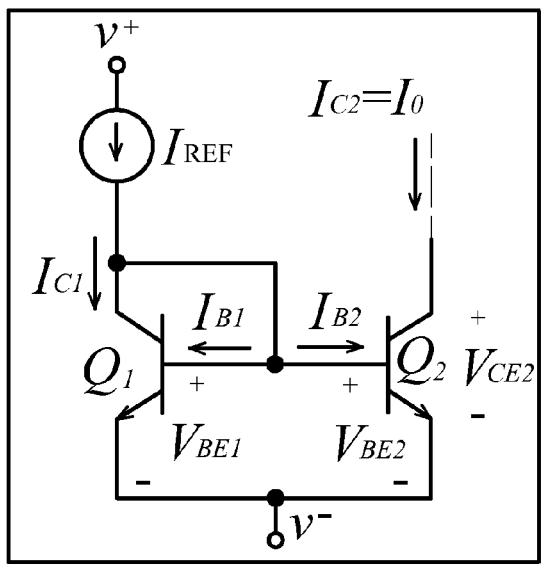 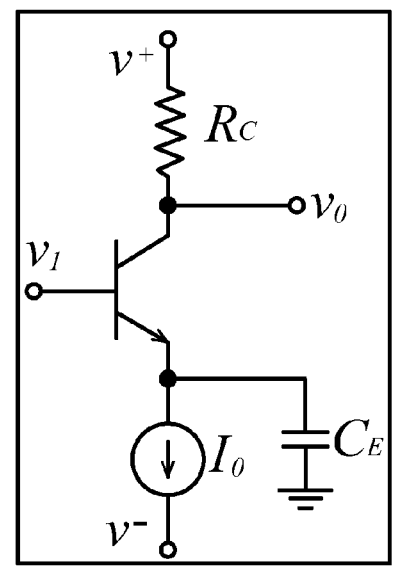
Fig. 13a  Fig. 13b

DEVICE AND METHOD FOR SETTING RESISTIVE RANDOM ACCESS MEMORY CELL

BACKGROUND

Resistive random access memory (RRAM) is one possible candidate for next generation nonvolatile memory technology due to its simple and CMOS logic compatible process. The RRAM cell includes a metal oxide material sandwiched between top and bottom electrodes. By applying voltage to the RRAM cell, a switching event from high resistance state (HRS) to low resistance state (LRS) occurs and is called the "set" process. Conversely, the switching event from LRS to HRS is called the "reset" process. The low and high resistance are utilized to indicate a digital signal, "1" or "0", thereby allowing for data storage.

SUMMARY

In accordance with the teachings described herein, a device and method for setting a resistive random access memory cell are provided. An exemplary method includes: providing a set current to a bit line of the RRAM cell by a current source.

An exemplary device includes: a first RRAM cell and a current source. The first RRAM cell is connected to a first word line. The current source is selectively connected to the first bit line, wherein the current source selectively provides a current to the first bit line of the first RRAM cell to set the first RRAM cell.

BRIEF DESCRIPTION OF THE DRAWINGS

FIG. 3 is an exemplary table of the three processes (set, reset and read) of the RRAM consistent with an embodiment of the present invention.

FIGS. 8a, 8b, 8c and 8d are exemplary diagrams of various embodiments of a RRAM consistent with the present invention.

FIG. 9 is an exemplary table of the three processes (set, reset and read) of the RRAM cells illustrated in FIGS. 8a, 8b, 8c and 8d.

FIG. 12 is an exemplary diagram of an array of RRAM according the exemplary embodiments of FIG. 8 during a read process.

FIGS. 13a-13g are diagrams of exemplary current sources that may be used in embodiments of the present invention.

DETAILED DESCRIPTION

Reference will now be made in detail to exemplary embodiments, which are illustrated in the accompanying drawings. Wherever possible, the same reference numbers will be used throughout the drawings to refer to the same or like parts.

Figure 1:
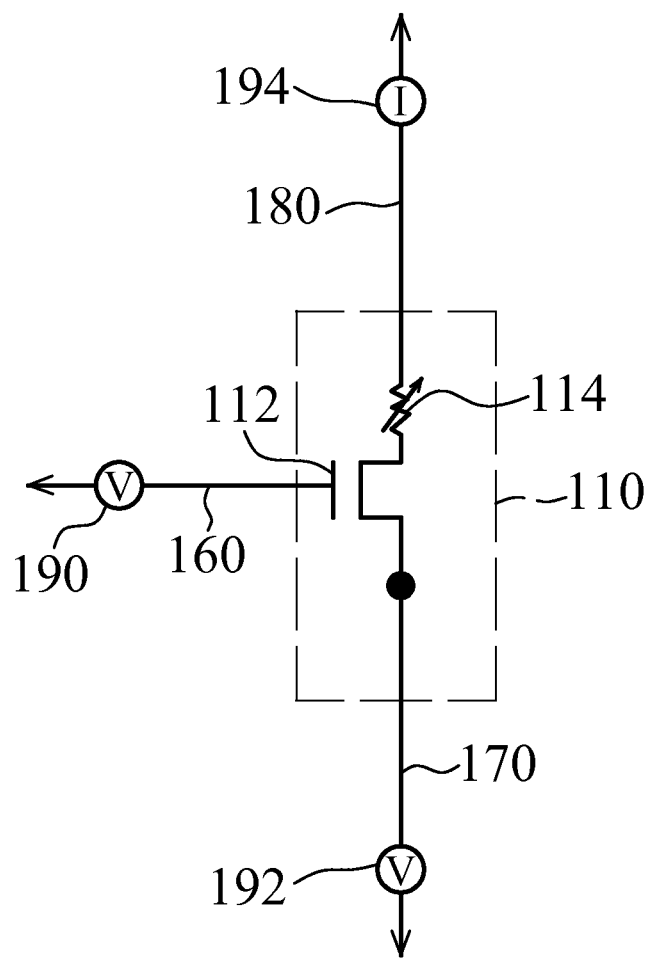
FIG. 1 is exemplary diagram for a resistive random access memory cell according to a first embodiment.

FIG. 1 is exemplary diagram for a resistive random access memory according to a first embodiment. As shown in FIG. 1, a RRAM (resistive random access memory) 100 is provided. The RRAM 100 may include a first RRAM cell 110, a first voltage source 190, a second voltage source 192, and a current source 194. The first RRAM cell 110 includes a first transistor 112 and a first variable resistor 114.

In an embodiment of the invention, a variable resistor may be formed by a three layer structure including a top electrode layer, a bottom electrode layer and a variable resistance material layer. In general, after the variable resistor is initially fabricated, the variable resistance material layer does not exhibit switching properties. Then, the forming process described herein is performed to form one or more localized conductive filament(s) with oxygen vacancies. After that, a set process and a reset process may be performed on the variable resistor. Whenever a filament is referred to within this document, it should be appreciated that one or more filaments within the variable resistance material layer. In an embodiment of the invention, the top electrode layer may be formed of, for example, Tantalum Nitride and Titanium. The bottom electrode layer may be formed of, for example, Titanium Nitride. The variable resistance material layer may be formed of, for example, Hafnium dioxide.

The gate of the first transistor 112 of the first RRAM cell 110 may be connected to a first word line 160. The drain of the first transistor 112 of the first RRAM cell 110 is connected to one terminal of the first variable resistor 114. The source of the first transistor 112 of the first RRAM cell 110 may be connected to a first source line 170. The other terminal of the first variable resistor 114 may be connected to a first bit line 180.

The first voltage source 190 may be connected to the first word line 160. The second voltage source 192 may be connected to the first source line 170. The current source 194 may be connected to the first bit line 180. The first voltage source 190 may provide a first voltage to the first word line 160 to turn on the first transistor 112 of the first RRAM cell 110. The second voltage source 192 may provide a second voltage to the first source line 170. The current source 194 may provide a set current to the first bit line 180 of the first RRAM cell 110 to set the first RRAM cell 110.

The first voltage may be, for example, 1.2 to 1.6 Volts and turn on the first transistor 112 of the first RRAM cell 110. The set current supplied by the current source 194 may be, for example, 1 micro Ampere to 500 micro Ampere. The set current may be a relatively constant current. The second voltage may be ground.

The set current supplied by the current source 194 sets the first RRAM cell 110 so as to substantially maintain the filament(s) in the first variable resistor 114 of the first RRAM cell 110 and maintain the read current of the first transistor 112. Furthermore, due to the set current supplied by the current source 194, additional current limiters may not be needed, which improves memory density. Therefore, by using set current supplied by the current source 194 to set the first RRAM cell 110 results in leaving the variable resistor 114 substantially undamaged and substantially maintaining the read current of the first transistor 112.

Figure 2A:
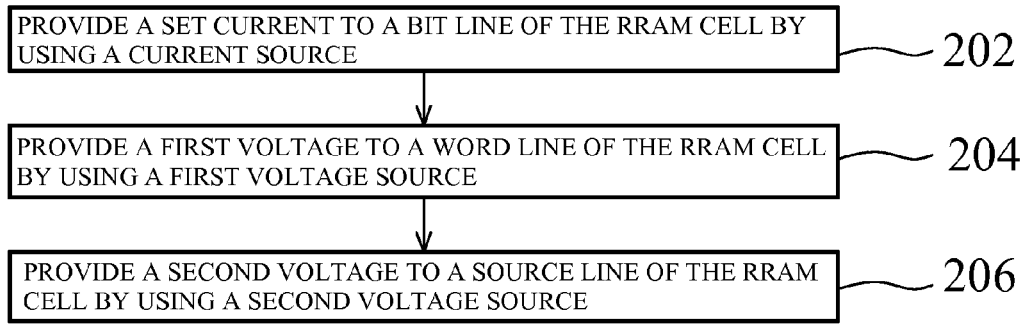
FIG. 2A is a first exemplary flow chart for setting a RRAM cell.

FIG. 2A is a first exemplary flow chart for setting a RRAM cell. The method 200 may include: providing a set current to a bit line of the RRAM cell by using a current source (202); providing a first voltage to a word line of the RRAM cell by using a first voltage source(204); and providing a second voltage to a source line of the RRAM cell by using a second voltage source (206). In an embodiment of the invention, the RRAM cell may include a transistor and a variable resistor.

Figure 2B:
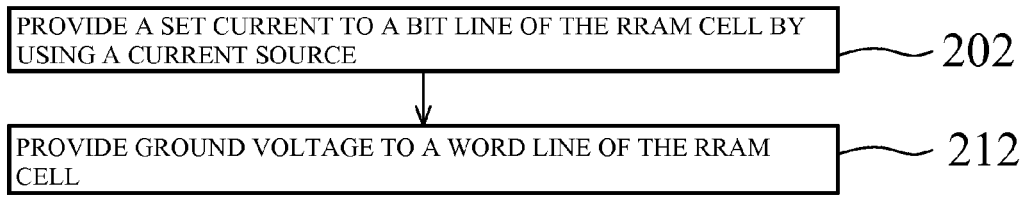
FIG. 2B is a second exemplary flow chart for setting a RRAM cell.

FIG. 2B is a second exemplary flow chart for setting a RRAM cell. The method 210 may include: providing a set current to a bit line of the RRAM cell by using a current source (202); and providing ground voltage to a word line of the RRAM cell (212). In an embodiment of the invention, the RRAM cell may include a transistor and a variable resistor. In an embodiment of the invention, the RRAM cell may include a variable resistor and a selector. In an embodiment of the invention, the RRAM cell may include a variable resistor and a diode. In an embodiment of the invention, the set current is from 1 micro Ampere to 500 micro Ampere. In an embodiment of the invention, the set current is constant.

FIG. 3 is an exemplary table of the three processes (set, reset and read) of the RRAM cell consistent with an embodiment of the present invention. The RRAM cells herein may include one variable resistor and one transistor as shown in FIG. 1. The term "Selected" refers to those word lines, bit lines, and source lines that are connected to the RRAM cell to be set, reset, or read. The term "Unselected" refers to the those word lines, bit lines, and source lines that are not connected to the RRAM cell to be set, reset, or read. For example, the voltage "1.2-1.6V" is applied to, during a set process, the selected word line. The current "1 uA-500 uA" is applied to, during a set process, the selected bit line. The ground voltage is applied to, during a set process, the unselected word lines, the unselected bit lines, and the unselected source lines.

Figure 4:
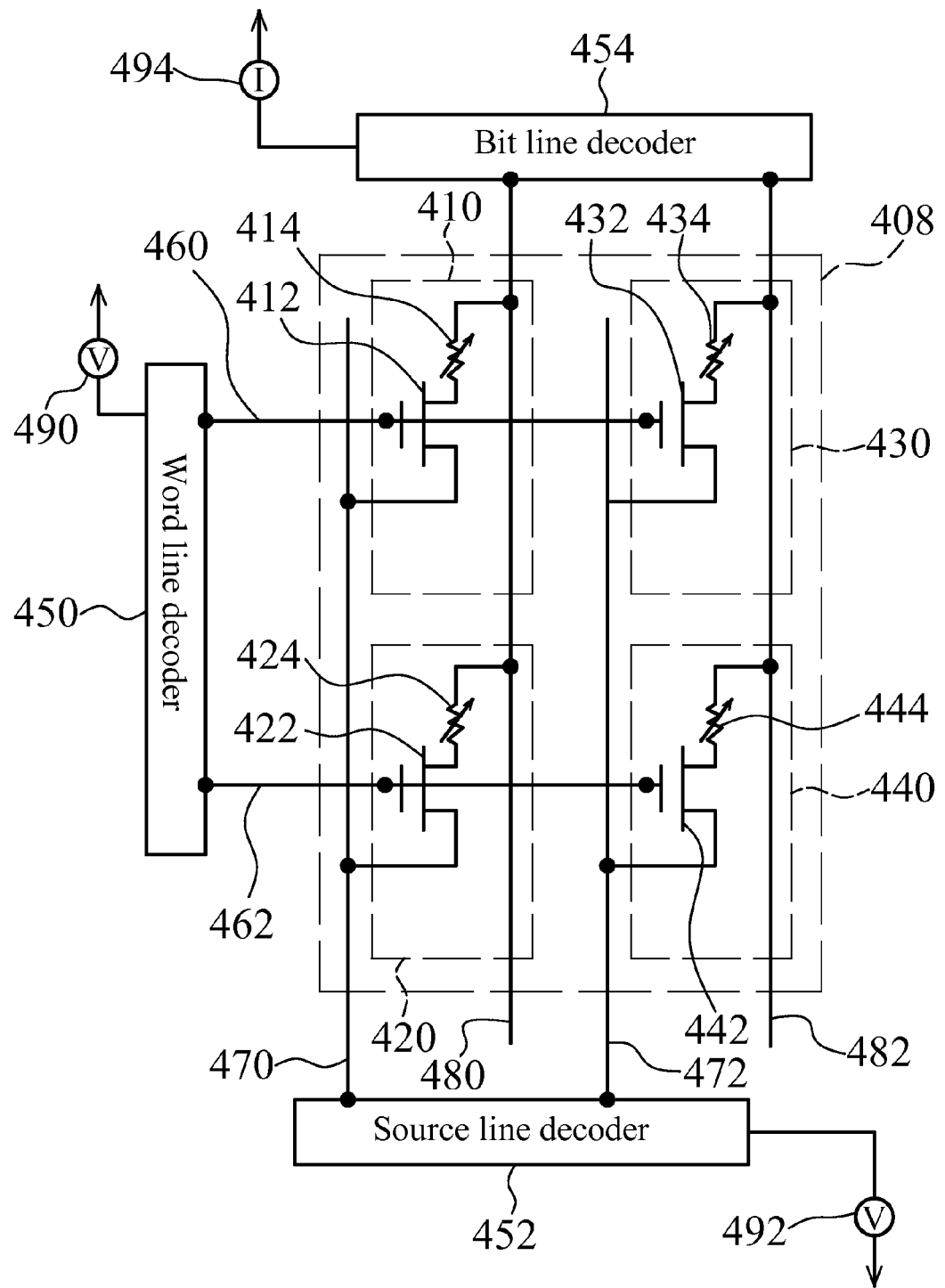
FIG. 4 is an exemplary diagram of a 4-cell RRAM consistent with an embodiment of the present invention.

FIG. 4 is an exemplary diagram of a 4-cell RRAM consistent with an embodiment of the present invention. The 4-cell RRAM and associated decoders 400 may include a 4-cell RRAM array 408 having RRAM cells 410, 420, 430, and 440; a word line decoder 450; a source line decoder 452; a bit line decoder 454; a first word line 460; a second word line 462; a first source line 470; a second source line 472; a first bit line 480; a second bit line 482; a first voltage source 490; a second voltage source 492; and a current source 494. The RRAM cells 410, 420, 430, 440 are configured similar to the RRAM cell 110 and details need not be repeated in this paragraph.

The RRAM cell 410 may be connected to the first word line 460, the first source line 470, and the first bit line 480. The RRAM cell 420 may be connected to the second word line 462, the first source line 470, and the first bit line 480. The RRAM cell 430 may be connected to the first word line 460, the second source line 472, and the second bit line 482. The RRAM cell 440 may be connected to the second word line 462, the second source line 472, and the second bit line 482.

The word line decoder 450 may be connected to the first word line 460, the second word line 462, and the first voltage source 490. The first voltage source 490 may provide a first voltage to the word line decoder 450. The word line decoder 450 may provide the first voltage to a selected word line. The source line decoder 452 may be connected to the first source line 470, the second source line 472, and the second voltage source 492. The second voltage source 492 may provide a second voltage to the source line decoder 452. The source line decoder 452 may provide the second voltage to a selected source line. The bit line decoder 454 may be connected to the first bit line 480, the second bit line 482, and the current source 494. The current source 494 may provide a set current to the bit line decoder 454. The bit line decoder 454 may provide the set current to a selected bit line.

Referring to FIGS. 3 and 4, for example, a process of setting the RRAM cell 410 is performed. The RRAM cell 410 may be taken as a "selected RRAM cell". By using the word line decoder 450, the first word line 460 connected to the selected RRAM cell 410 may receive the first voltage (about 1.2-1.6 Volts) from the first voltage source 490. By using the bit line decoder 454, the first bit line 480 connected to the selected RRAM cell 410 may receive the current (about 1 micro to 500 micro Ampere) from the current source 494. By using the source line decoder 452, the first source line 470 connected to the selected RRAM cell 410 may receive the second voltage (ground voltage) from the second voltage source 492. Therefore, the RRAM cell 410 may be set accordingly. For those RRAM cells 420, 430, 440 which are taken as "unselected RRAM cells", the second word line 462, the second source line 472, and the second bit line 482 connected thereto may be grounded.

Figure 5:
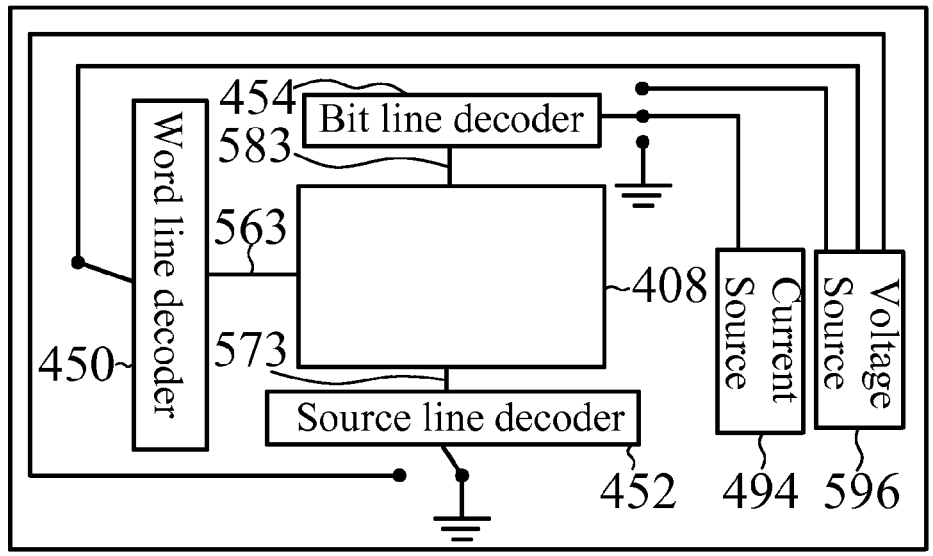
FIG. 5 is an exemplary diagram of a RRAM during a set process.

FIG. 5 is an exemplary diagram of a RRAM during a set process. The RRAM 500 may include a RRAM array 408, a word line decoder 450, a source line decoder 452, a bit line decoder 454, a word line bus 563, a source line bus 573, a bit line bus 583, a current source 494 and a voltage source 596. The RRAM array 408 may include the RRAM cells 410, 420, 430, 440. The RRAM array 408 may be connected to the bit line decoder 454 via the bit line bus 583, connected to the word line decoder 450 via the word line bus 563, and connected to the source line decoder 455 via the source line bus 573. The word line bus 563 may include the first word line 460 and the second word line 462. The source line bus 573 may include the first source line 470 and the second source line 472. The bit line bus 583 may include the first bit line 480 and the second bit line 482. The voltage source 596 may include multiple voltage sources and provide several voltages. To be more specific, the current source 494 may be selectively connected to the first bit line 480, and may selectively provide current to the first bit line 480 of the first RRAM cell to set the first RRAM cell 410.

Referring to FIGS. 3 and 5, for example, a process of setting a selected RRAM cell in the RRAM array 408 is performed. By using the word line decoder 450 and the word line bus 563, the word line connected to the selected RRAM cell may receive the voltage (about 1.2-1.6 Volts) from the voltage source 596. By using the bit line decoder 454 and the bit line bus 583, the bit line connected to the selected RRAM cell may receive the current (about 1 micro to 500 micro Ampere) from the current source 494. By using the source line decoder 452 and the source line bus 573, the source line connected to the selected RRAM cell may receive the ground voltage. Therefore, the selected RRAM cell in the RRAM array 408 may be set accordingly. For those unselected RRAM cells, the word line(s), the source line(s), and the bit line(s) connected thereto may be grounded.

Figure 6:
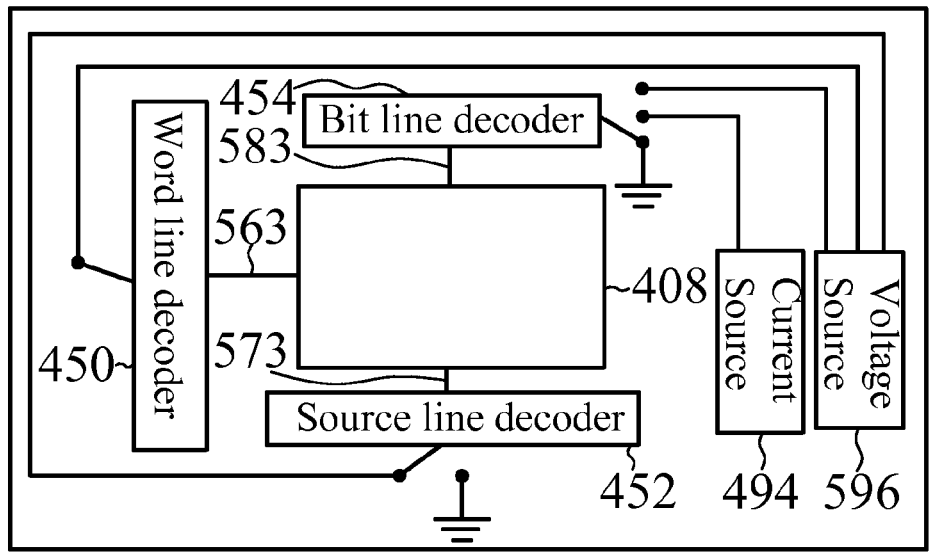
FIG. 6 is an exemplary diagram of a RRAM during a reset process.

FIG. 6 is an exemplary diagram of a RRAM during a reset process. The RRAM 600 is provided and is configured similar to the RRAM 500. In the RRAM 600, the bit line decoder 454 may be connected to ground. The source line decoder 452 and the word line decoder 450 may be connected to the voltage source 596.

Referring to FIGS. 3 and 6, for example, a process of resetting a selected RRAM cell in the RRAM array 408 is performed. By using the word line decoder 450 and the word line bus 563, the word line connected to the selected RRAM cell may receive the voltage (about 2.0-2.4 Volts) from the voltage source 596. By using the bit line decoder 454 and the bit line bus 583, the bit line connected to the selected RRAM cell may be grounded. By using the source line decoder 452 and the source line bus 573, the source line connected to the selected RRAM cell may receive the voltage (about 1.7-2.0 Volts) from the voltage source 596. Therefore, the selected RRAM cell in the RRAM array 408 may be reset accordingly. For those unselected RRAM cells, the word line(s), the source line(s), and the bit line(s) connected thereto may be grounded.

Figure 7:
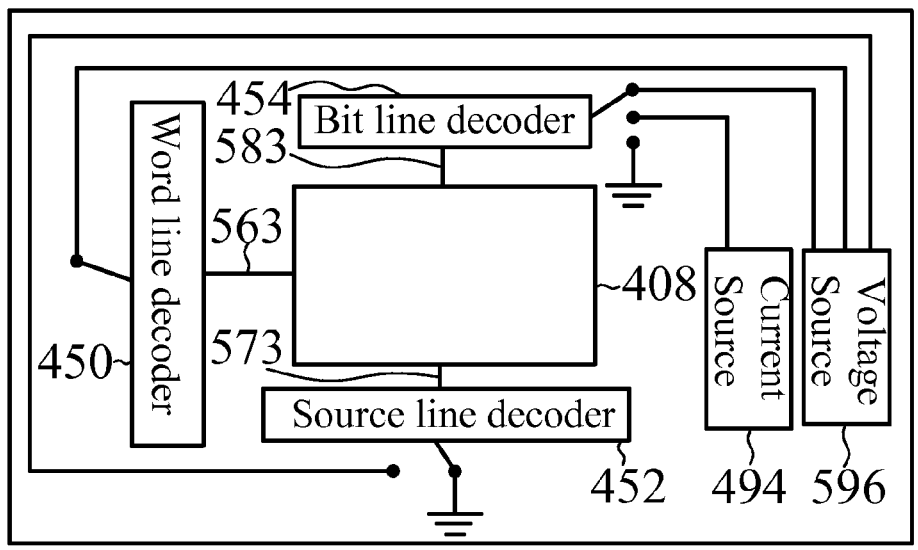
FIG. 7 is an exemplary diagram of a RRAM during a read process.

FIG. 7 is an exemplary diagram of a RRAM during a read process. The RRAM 600 is provided and is configured similar to the RRAM 500. In the RRAM 700, the source line decoder 452 may be connected to ground. The word line decoder 450 and the bit line decoder 454 may be connected to the voltage source 596.

Referring to FIGS. 3 and 7, for example, a process of reading a selected RRAM cell in the RRAM array 408 is performed. By using the word line decoder 450 and the word line bus 563, the word line connected to the selected RRAM cell may receive the voltage (about 1.1 Volts) from the voltage source 596. By using the bit line decoder 454 and the bit line bus 583, the bit line connected to the selected RRAM cell may receive the voltage (about 0.3 Volts) from the voltage source 596. By using the source line decoder 452 and the source line bus 573, the source line connected to the selected RRAM cell may be grounded. Therefore, the selected RRAM cell in the RRAM array 408 may be read accordingly. For those unselected RRAM cells, the word line(s), the source line(s), and the bit line(s) connected thereto may be grounded.

Figures 8A, 8B:
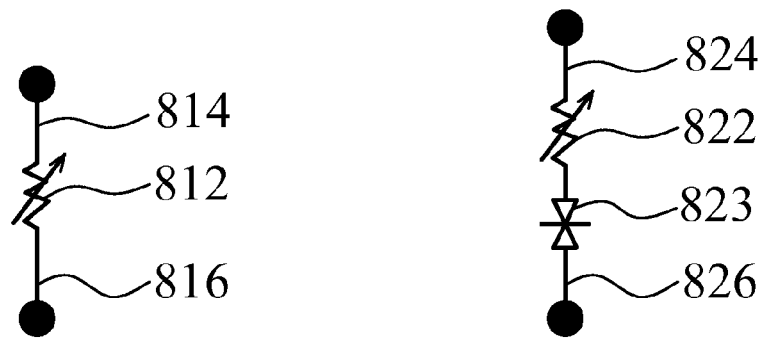

FIGS. 8a, 8b, 8c and 8d are exemplary diagrams of various embodiments of a RRAM consistent with the present invention. As shown in FIG. 8a, a RRAM cell 810 is provided. The RRAM cell 810 may include a variable resistor 812, a bit line 814, and a word line 816. As shown in FIG. 8b, a RRAM cell 820 is provided. The RRAM cell 820 may include a variable resistor 822, a selector 823, a bit line 824, and a word line 826. As shown in FIG. 8c, a RRAM cell 830 is provided. The RRAM cell 830 may include a variable resistor 832, a diode 833, a bit line 834, and a word line 836. As shown in FIG. 8d, a RRAM cell 840 is provided. The RRAM cell 840 may include a variable resistor 842, a diode 843, a bit line 844, and a word line 846. The difference between the RRAM cell 830 and the RRAM cell 840 is the polarity of the diodes.

FIG. 9 is an exemplary table of the three processes (set, reset and read) of the RRAM cells illustrated in FIGS. 8a, 8b, 8c and 8d. The RRAM cells herein may include one variable resistor as shown in FIG. 8a, one variable resistor and one selector as shown in FIG. 8b, or one variable resistor and one diode as shown in FIGS. 8c, 8d. The term "Selected" refers to those word lines and bit lines that are connected to the RRAM cell to be set, reset or read. The term "Unselected" refers to those word lines and bit lines that are not connected to the RRAM cell to be set, reset or read. For example, the ground voltage is applied to, during a set process, the selected word line. The current "1 uA-500 uA" is applied to, during a set process, the selected bit line.

Figure 10:
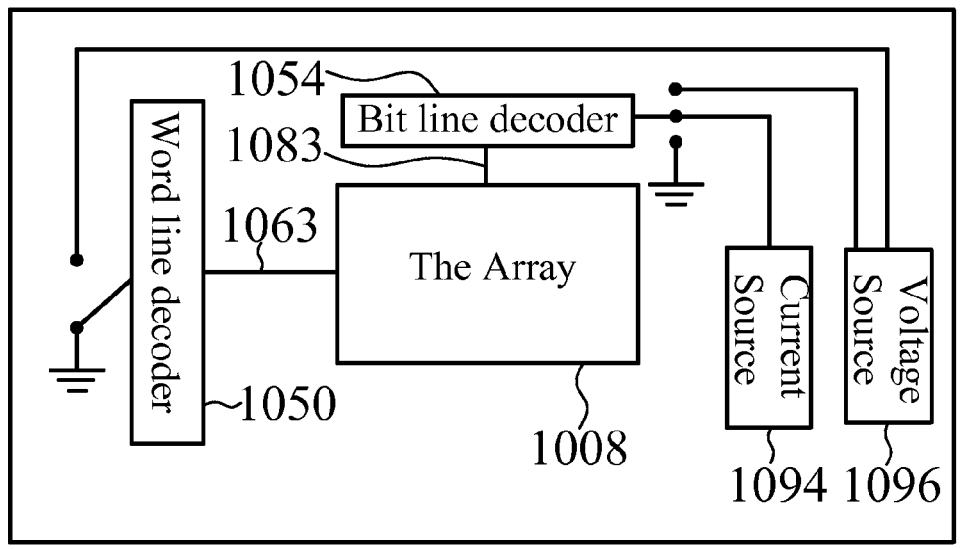
FIG. 10 is an exemplary diagram of an array of RRAM according to the exemplary embodiments of FIG. 8 during a set process.

FIG. 10 is an exemplary diagram of an array of RRAM according to the exemplary embodiments of FIG. 8 during a set process. The RRAM 1000 may include a RRAM array 1008, a word line decoder 1050, a bit line decoder 1054, a word line bus 1063, a bit line bus 1083, a current source 1094 and a voltage source 1096. The RRAM array 1008 may include RRAM cells. The RRAM array 1008 may be connected to the bit line decoder 1054 via the bit line bus 1083, and connected to the word line decoder 1050 via the word line bus 1063. The word line bus 1063 may include word lines. The bit line bus 1083 may include bit lines. The voltage source 1096 may include multiple voltage sources and provide several voltages. To be more specific, the current source 1094 may be selectively connected to the selected bit line, and may selectively provide current to the selected bit line of the selected RRAM cell to set the selected RRAM cell.

Referring to FIGS. 9 and 10, for example, a process of setting a selected RRAM cell in the RRAM array 1008 is performed. By using the word line decoder 1050 and the word line bus 1063, the word line connected to the selected RRAM cell may be grounded. By using the bit line decoder 1054 and the bit line bus 1083, the bit line connected to the selected RRAM cell may receive the current (about 1 micro to 500 micro Ampere) from the current source 1094. Therefore, the selected RRAM cell in the RRAM array 1008 may be set accordingly. For those unselected RRAM cells, the word line(s) and the bit line(s) connected thereto may be floating or be connected to a voltage of about 0.3 Volts.

Figure 11:
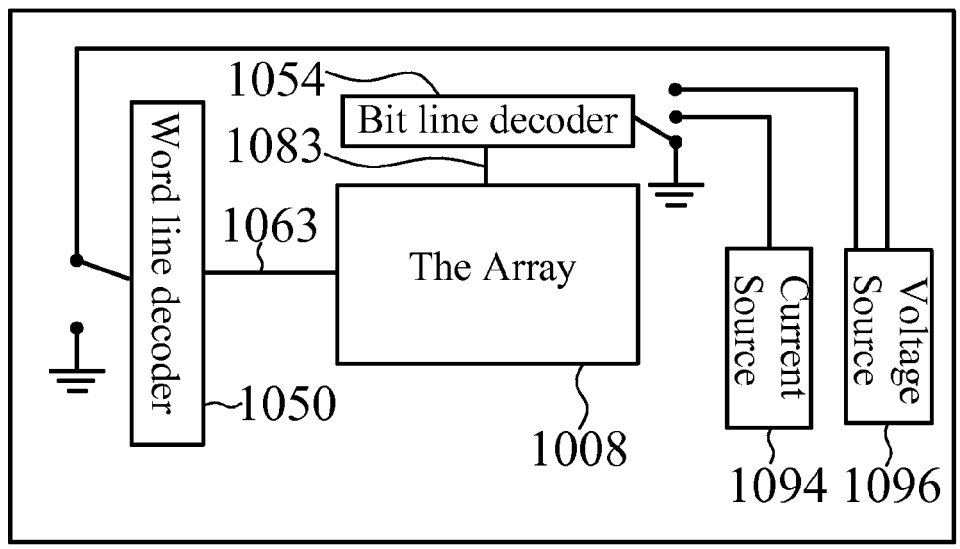
FIG. 11 is an exemplary diagram of an array of RRAM according the exemplary embodiments of FIG. 8 during a reset process.
Figure 13C:
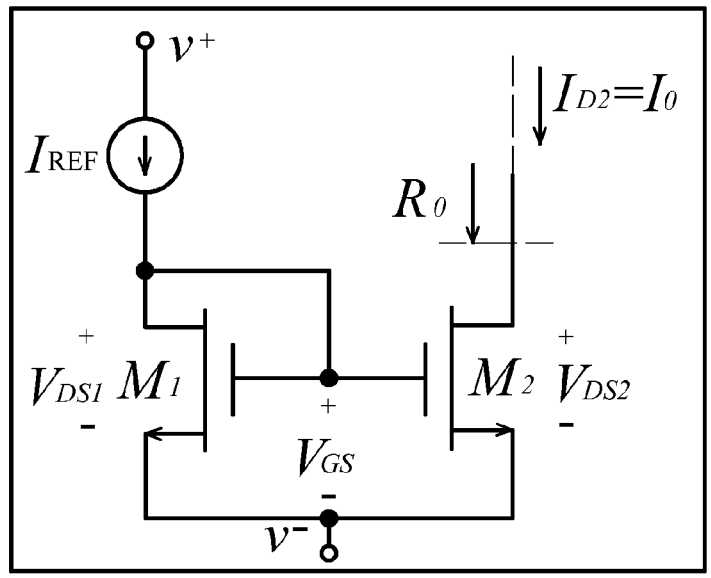
Figure 13D:
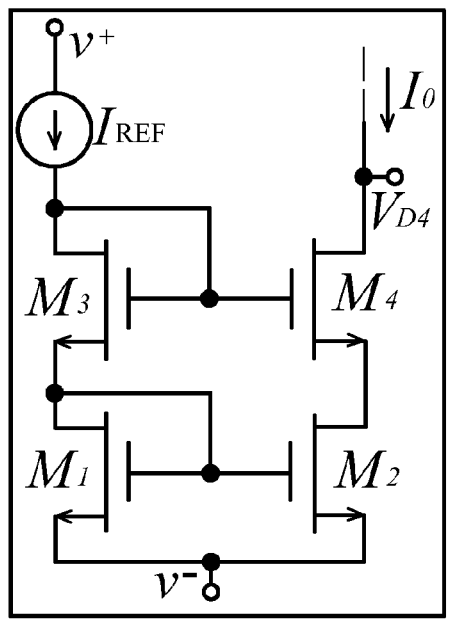
Figure 13E:
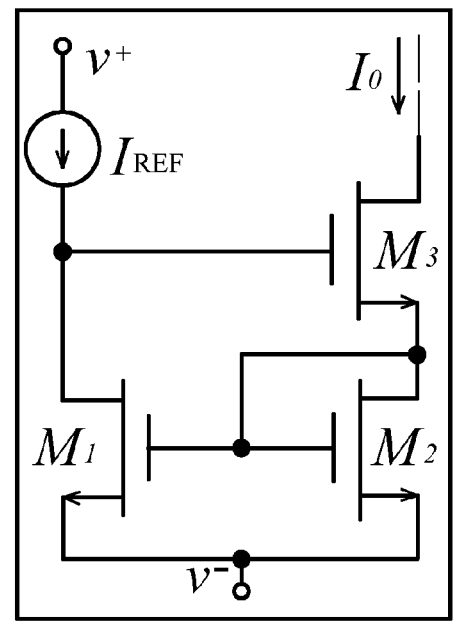
Figure 13F:
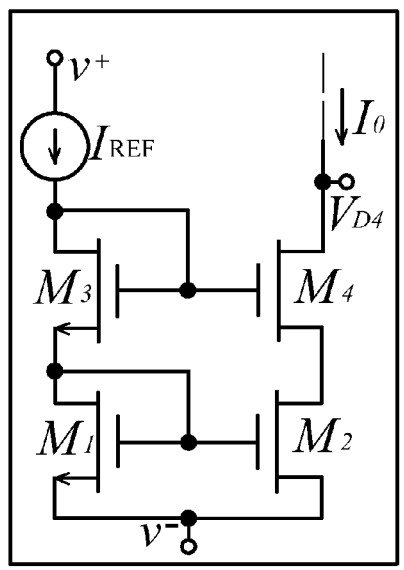
Figure 13G:
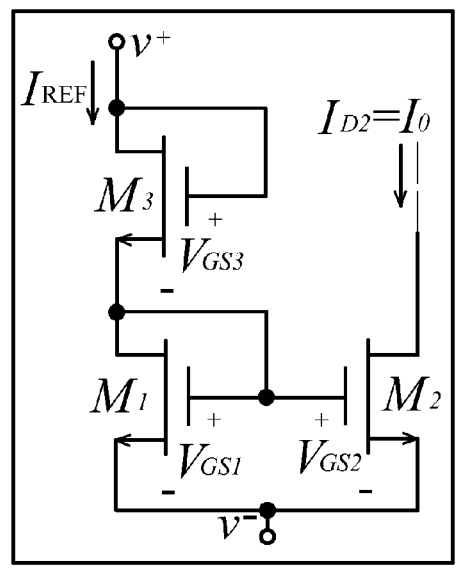

FIG. 11 is an exemplary diagram of an array of RRAM according the exemplary embodiments of FIG. 8 during a reset process.

The RRAM 1100 is provided and is configured similar to the RRAM 1000. In the RRAM 1100, the bit line decoder 1054 may be connected to ground. The word line decoder 1050 may be connected to the voltage source 1096.

Referring to FIGS. 9 and 11, for example, a process of resetting a selected RRAM cell in the RRAM array 1008 is performed. By using the word line decoder 1050 and the word line bus 1063, the word line connected to the selected RRAM cell may receive the voltage (about 1.7-2.0 Volts) from the voltage source 1096. By using the bit line decoder 1054 and the bit line bus 1083, the bit line connected to the selected RRAM cell may be grounded. Therefore, the selected RRAM cell in the RRAM array 1008 may be reset accordingly. For those unselected RRAM cells, the word line(s) and the bit line(s) connected thereto may be grounded.

FIG. 12 is an exemplary diagram of an array of RRAM according the exemplary embodiments of FIG. 8 during a read process. The RRAM 1200 is provided and is configured similar to the RRAM 1000. In the RRAM 1200, the bit line decoder 1054 may be connected to the voltage source 1096. The word line decoder 1050 may be grounded.

Referring to FIGS. 9 and 12, for example, a process of reading a selected RRAM cell in the RRAM array 1008 is performed. By using the word line decoder 1050 and the word line bus 1063, the word line connected to the selected RRAM cell may be grounded. By using the bit line decoder 1054 and the bit line bus 1083, the bit line connected to the selected RRAM cell may receive the voltage (about 0.3 Volts) from the voltage source 1096. Therefore, the selected RRAM cell in the RRAM array 1008 may be read accordingly. For those unselected RRAM cells, the word line(s) and the bit line(s) connected thereto may be grounded.

FIGS. 13a-13g are diagrams of exemplary current sources that may be used in embodiments of the present invention.

Those current sources may be applied to the RRAMs 100, 400, 500, 600, 700, 1000, 1100, 1200 in FIGS. 1, 4-4, 10-12 respectively. Those skilled in the art upon reading this disclosure will appreciate that other charge pump circuits could be used. Furthermore, those current sources may provide constant current.

This written description uses examples to disclose the disclosure, include the best mode, and also to enable a person skilled in the art to make and use the disclosure. The patentable scope of the disclosure may include other examples that occur to those skilled in the art.

One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein may be manufactured, used, or shipped in a number of positions and orientations. Persons skilled in the art will recognize various equivalent combinations and substitutions for various components shown in the figures.

What is claimed is:

1. A device, comprising:
    a bit line;
    a resistive random access memory (RRAM) cell connected to the bit line;
    a voltage source selectively connected to the bit line to provide a voltage to select the bit line during a read process of the RRAM cell; and
    a current source selectively connected to the bit line to provide a constant current during a set process in which the RRAM cell switches from a high resistance state to a low resistance state.

2. The device of claim 1, further comprising:
    a word line connected to the RRAM cell; and
    a first voltage source selectively connected to the word line and configured to provide a first voltage.

3. The device of claim 1, further comprising:
    a source line connected to the RRAM cell; and
    a second voltage source selectively connected to the source line and configured to provide a second voltage.

4. The device of claim 1, wherein the RRAM cell includes a transistor and a variable resistor.

5. The device of claim 1, wherein the RRAM cell includes a variable resistor.

6. The device of claim 1, wherein the RRAM cell includes a variable resistor and a selector.

7. The device of claim 1, wherein the RRAM cell includes a variable resistor and a diode.

8. The device of claim 1, wherein the substantially constant current is from about 1 micro Ampere to about 500 micro Amperes.

9. A method for setting a resistive random access memory (RRAM) cell, comprising:
    a bit line decoder selectively connecting a current source and a voltage source to a bit line that is connected to the RRAM cell; and
    the current source providing a substantially constant current during a set process in which the RRAM cell switches from a high resistance state to a low resistance state.

10. The method of claim 9, further comprising:
    a word line decoder selectively connecting a first voltage source to a word line that is connected to the RRAM cell; and
    the first voltage source providing a first voltage.

11. The method of claim 9, further comprising:
    a source line decoder selectively connecting a second voltage source to a source line that is connected to the RRAM cell; and
    the second voltage source providing a second voltage.

12. The method of claim 9, further comprising:
    the bit line decoder connecting the voltage source to the bit line during a read operation; and
    the voltage source providing a voltage.

13. The method of claim 9, wherein the substantially constant current is from about 1 micro Ampere to about 500 micro Amperes.

14. A device, comprising:
    a bit line;
    a resistive random access memory (RRAM) cell connected to the bit line;
    a bit line decoder connected to the bit line and selectively connected to a current source and a voltage source; and
    wherein the current source is connected to the bit line to provide a constant current during a set process in which the RRAM cell switches from a high resistance state to a low resistance state.

* * * * *